United States Patent
Madsen et al.

[19]

[11] Patent Number: 6,020,770
[45] Date of Patent: Feb. 1, 2000

[54] TRANSPARENT LATCH-BASED SEQUENCER AND SEQUENCE CONTROLLING METHOD

[75] Inventors: Jan Madsen, Tempe; Paul Robert Handly, Gilbert; Robert Ivan Foster, Mesa, all of Ariz.

[73] Assignee: Motorola, Inc., Schaumburg, Ill.

[21] Appl. No.: 09/073,526

[22] Filed: May 6, 1998

[51] Int. Cl.[7] .................................................. H03B 19/00
[52] U.S. Cl. ........................................... 327/117; 327/115
[58] Field of Search .................................... 327/115, 117; 377/47, 48; 341/100, 101; 370/336

[56] References Cited

U.S. PATENT DOCUMENTS

| | | | |
|---|---|---|---|
| 3,851,258 | 11/1974 | Freedman | 328/63 |
| 4,678,281 | 7/1987 | Bauer | 350/331 |
| 4,901,076 | 2/1990 | Askin et al. | 341/100 |
| 5,223,833 | 6/1993 | Akata | 341/100 |
| 5,341,031 | 8/1994 | Kinoshita et al. | 307/269 |

*Primary Examiner*—Toan Tran
*Assistant Examiner*—Anh-Quan Tra
*Attorney, Agent, or Firm*—Gregory J. Gorrie

[57] ABSTRACT

A sequence-controlled digital circuit (21) is presented. The circuit (21) includes a divider (55) and a plurality of transparent latches (51–54) which together form a latch-based sequencer (42). Typically, a clock signal (43) is divided by the divider (55) into an inverted half-clock signal (45) and a non-inverted half-clock signal (44), each enabling alternate latches (51–54) arranged in a cascade. In the cascade, an output of each latch (51–54) drives an input of the following latch (51–54), one such being an inverting output and the rest non-inverting outputs, to form a twisted-loop counter (50). Each output of each latch (51–54) drives a clock input of a flip-flop (61–68), with a serial input signal (46) driving all data inputs, to form a temporal-to-spacial converter (40). Only the divider (55) operates at the rate of the clock signal (43).

19 Claims, 5 Drawing Sheets

TRANSPARENT LATCH-BASED SEQUENCER AND SEQUENCE CONTROLLING METHOD

FIELD OF THE INVENTION

The present invention relates to the field of digital circuits. More specifically, the present invention relates to the filed of digital sequencing circuits.

BACKGROUND OF THE INVENTION

As technology advances, a need arises for digital circuitry capable of processing data at high data rates, e.g., in excess of a few hundred Megabits per second. At these data rates, integrated circuits fabricated of high-speed semiconductor materials have a maximum gate count significantly lower than that of more conventional technologies. That is, a high-speed chip may contain hundreds of gates, whereas a conventional silicon chip may contain hundreds of thousands of gates.

The number of gates, or more precisely the chip area, used by a given digital circuit on a high-speed substrate is therefore of significant importance to the designer. Assuming a specific number of gates per chip, the fewer the number of gates required per circuit, the greater the number of circuits per chip. This in turn effects a decrease in the number of chips required of a given device and decreases the overall production cost of that device.

Additionally, power consumption is often a limiting design factor. Satellites, portable telephones, and other communications devices, for example, may be powered by solar cells, batteries, or other limited power sources. Any reduction in circuit power consumption is therefore a prime consideration in the design of such devices. For a given technology at a given data rate, a single gate requires a specific amount of power. Therefore, the fewer the number of gates required for a given circuit, the less power that circuit requires, and the more efficient the circuit becomes. When this effect is multiplied by the number of circuits required of a typical device, the savings in power, hence the increase in efficiency, may be considerable.

When the constraints of power are coupled with high data rates, the problem is exacerbated. For a given gate in a given technology, a decrease in data rate often brings about a corresponding decrease in power consumption. Therefore, the fewer gates in a given circuit operating at a high data rate the lower the circuit power consumption, the lower the chip power consumption, and the lower the device power consumption.

Power consumption equates with heat. The less power consumed by a device, the less heat generated and the less heat that must be dissipated. On the chip level, a reduction in chip power consumption results in a decrease in chip temperature and an increase in chip longevity. This can be a critical factor in the design of devices, such as satellites, where the replacement of prematurely failed chips is impractical.

Normally, the lower the data rate of a given circuit, the easier it is to implement. High data rate circuits often require more precise and more exotic techniques of design and implementation. Since the trend is toward higher and higher data rates, there is an ongoing increase in design exoticism, with a correspondingly increasing design cost. It is of benefit to the designer, therefore, to minimize the number of gates per chip dedicated to processing data at high data rates.

FIG. 1 depicts a prior-art eight-bit temporal-to-spacial converter 10 containing a twisted-ring (Johnson) counter 11.

In the embodiment of FIG. 1, counter 11 is a sequencer made up of n/2 clocked D-type flip-flops 12, where N is the number of states of counter 11, i.e., the number of bits of converter 10. Each flip-flop 12 is clocked by a clock signal 13. Therefore, each flip-flop 12 in counter 11 operates at the rate of clock signal 13 (rate S).

Converter 10 also contains a shift register 14 made up of N clocked d-type flip-flops 12 configured to convert a serial input signal 15 into a parallel output signal 16. Each flip-flop 12 of shift register 14 is also clocked by clock signal 13. Therefore, each flip-flop 12 in shift register 14 also operates at rate S.

Additionally, converter 10 contains a transfer register 17 also made up of clocked D-type flip-flops 12. Flip-flops 12 in transfer register 17, however, are clocked by a transfer signal 18 generated by counter 11. Since counter 11 has N states, i.e., requires N cycles of clock signal 13 per cycle of counter 11, flip-flops 12 of transfer register 17 need only operate at rate S/N.

Since, as is well known in the art, each flip-flop 12 is made up of two latches (not shown), with each latch being made up of two to four gates (not shown), the conventional embodiment of converter 10, as depicted in FIG. 1, contains twenty-four latches (forty-eight to ninety-six gates) encompassed in counter 11 and shift register 14, all of which operate at rate S. Assuming high-speed operation, e.g., in the multi-gigabit per second range, converter 10 represents a significant combination of the problems discussed above. Therefore, any reduction in gate count and/or gate rate is highly desirable.

It is an advantage of the present invention, therefore, that the power consumption and related heat dissipation of a given device are reduced. This is effected in one form by significantly reducing the number of gates per circuit for circuits involving sequencers. This is effected in another form by reducing the number of those gates requiring the full high-speed data rates and the design exoticism associated therewith.

It is also an advantage of the present invention that the performance of high-data-rate circuits involving sequencers is improved. This is effected in one form by reducing the loading of certain signal lines in circuits involving sequencers.

It is another advantage of the present invention that the production and design costs of a given device are reduced. This is effected in one form by significantly reducing the number of gates per circuit for circuits involving sequencers, thus increasing the number of circuits per chip and reducing the number of chips per device. This is effected in another form by reducing the number of those gates requiring the full high-speed data rates and the design exoticism associated therewith.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE DRAWINGS

Figure 2:
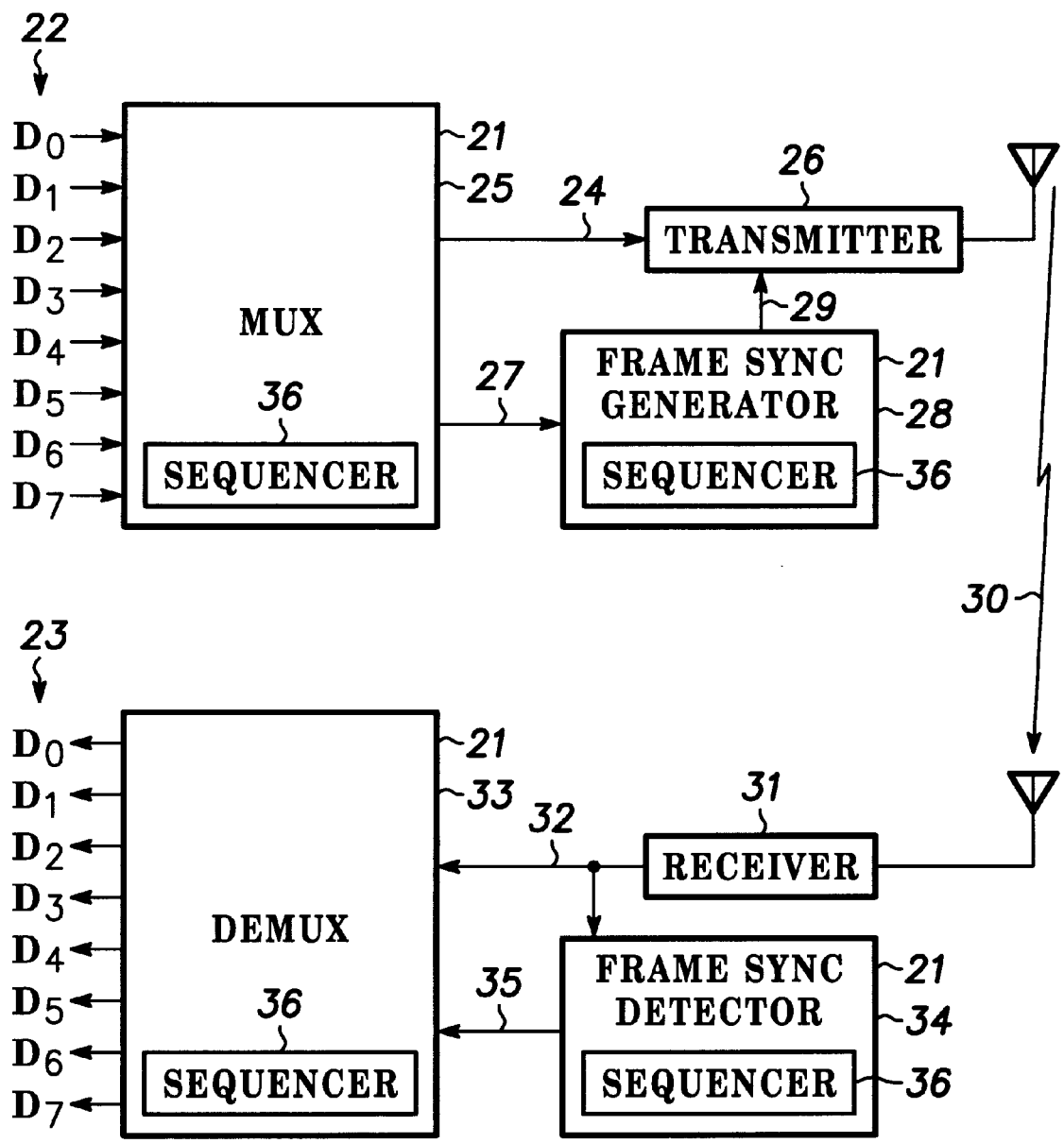
FIG. 2 depicts a digital communications system utilizing a plurality of sequence-controlled digital circuits in accordance with a preferred embodiment of the present invention.

FIG. 2 depicts a digital communications system 20 utilizing a plurality of sequence-controlled digital circuits 21 in accordance with a preferred embodiment of the present invention.

In communications system 20, parallel input data 22 is converted to serial data, framed, transmitted, received, and converted to parallel output data 23. Parallel output data 23 is substantially equal to parallel input data 22.

Parallel input data 22 is converted to serial data 24 by a spacial-to-temporal converter 25 (i.e., a parallel-to-serial converter or multiplexer). Converter 25 passes serial data 24 to a transmitter 26. Converter 25 also passes a synchronization signal 27 to a frame-synchronization generator 28. Generator 28 generates a frame-synchronization signal 29 and passes it to transmitter 26. Transmitter 26 combines serial data 24 and frame-synchronization signal 29 and transmits the result as a radio signal 30.

Radio signal 30 is received by a receiver 31. Receiver 31 receives and detects serial data 32 and passes it to a temporal-to-spacial converter 33 (i.e., a serial-to-parallel converter or demultiplexer) and a frame-synchronization detector 34. Detector 34 detects a received frame-synchronization signal 35, coincident with frame-synchronization signal 29 generated by generator 28, and passes it to converter 33. Converter 33 then converts received serial data 32 into parallel output data 23.

Four of the circuits encompassed within system 20 are sequence-controlled digital circuits 21. Spacial-to-temporal converter 25 includes a shift register (not shown) and an embodiment of a latch-based sequencer 36. Sequencer 36 generates synchronization signal 27, which controls the loading of the shift register with the bits of parallel input data 22. In this case, the embodiment of sequencer 36 may be a twisted-ring (Johnson) counter made up of (N/2)+2 latches, where N equals the number of states of the counter. An example of a similar sequencer embodiment is discussed below in conjunction with FIG. 3.

Frame-synchronization generator 28 and frame-synchronization detector 34 are essentially embodiments of sequencer 36 made up of modified latch-based ring counters utilizing combinatorial-logic feedback loops (not shown) and combinatorially-latched output circuits (not shown). An example of a similar sequencer embodiment is discussed below in conjunction with FIG. 4.

Temporal-to-spacial converter 33 includes a data register (not shown) and an embodiment of a latch-based sequencer 36. The data register is made up of N flip-flops (not shown), each of which is clocked by an output of sequencer 36. Sequencer 36 may be embodied as a twisted-ring counter made up of (N/2)+2 latches. An example of a similar temporal-to-spacial converter encompassing a similar sequencer embodiment is discussed below in conjunction with FIG. 3.

Figure 3:
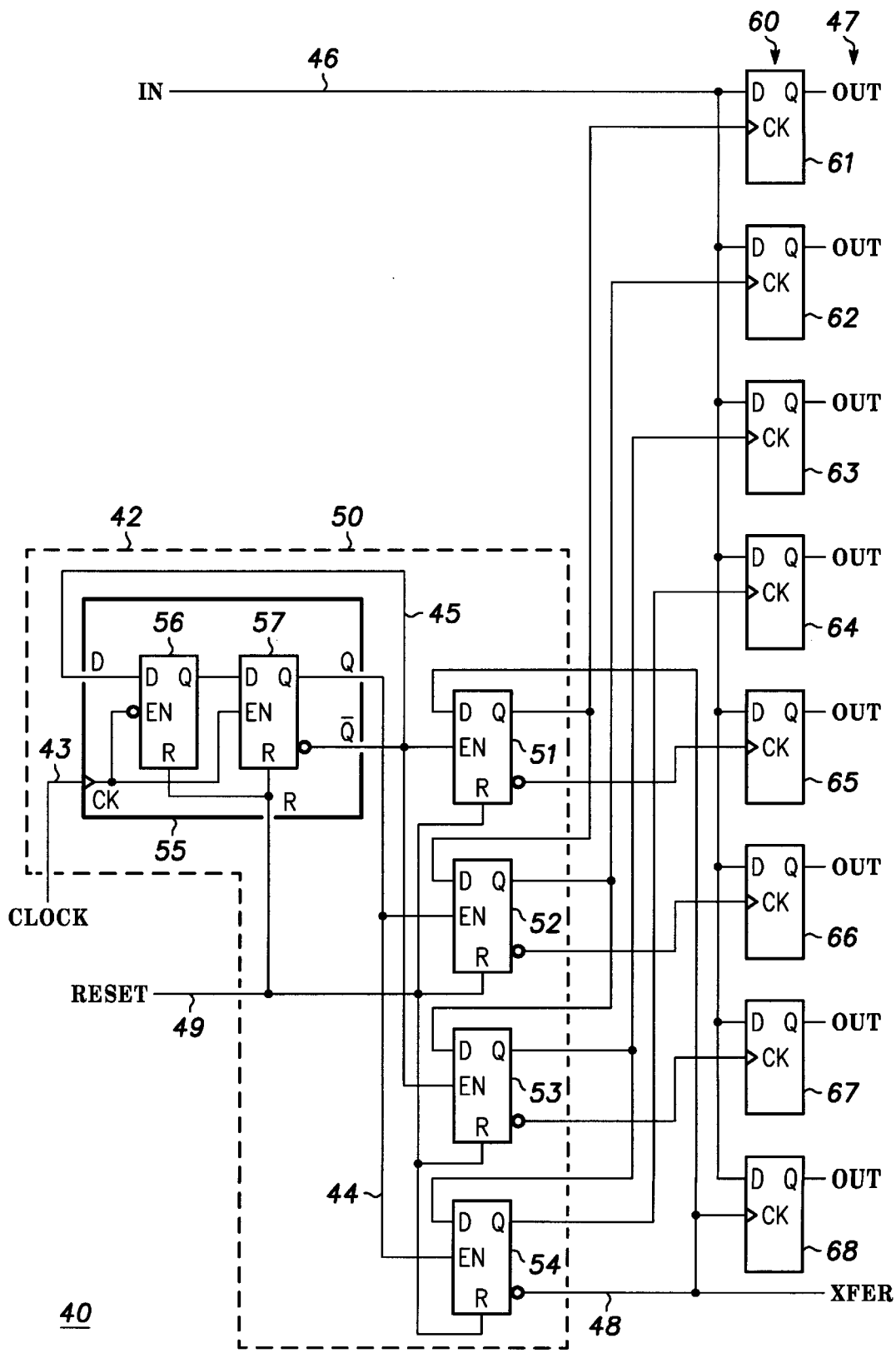
FIG. 3 depicts a sequence-controlled digital circuit configured as a temporal-to-spacial converter containing a latch-based twisted-ring counter in accordance with a preferred embodiment of the present invention.

FIG. 3 depicts a sequence-controlled digital circuit configured as a temporal-to-spacial converter 40 containing a latch-based twisted-ring counter 50 in accordance with a preferred embodiment of the present invention. The following discussion refers to FIG. 3.

Temporal-to-spacial converter 40 is depicted in FIG. 3 as an eight-bit converter 40 having an eight-state counter 50. This depiction should be taken as exemplary of an N-bit converter 40, where N is an integer multiple of four, is the number of bits converter 40 converts for each parallel output word, and is the number of states of counter 50.

Temporal-to-spacial converter 40 represents a preferred embodiment made up of a latch-based sequencer 42 embodied as a twisted-ring counter 50, and a data register 60. Counter 50 is implemented as a clock divider and N/2 transparent latches connected as a twisted ring. In the exemplary embodiment of FIG. 3, N equals eight and counter 50 includes N/2 equals four transparent latches 51, 52, 53, and 54, plus a divider 55.

Divider 55 is a clocked D-type flip-flop configured to divide a clock signal 43 by two. This produces a non-inverted half-clock signal 44 and an inverted half-clock signal 45. Half-clock signals 44 and 45 are alternately coupled to the enable (EN) inputs of transparent latches 51–54. Since this example has eight states, thus four latches 51–54, inverted half-clock signal 45 is connected to the enable inputs of latches (i-latches) 51 and 53, while non-inverted half-clock signal 44 is connected to the enable inputs of latches (n-latches) 52 and 54. Those skilled in the art will appreciate that these connections may be reversed without significantly affecting the operation of counter 50, and that such a reversal does not depart from the scope or intent of the present invention.

Counter 50 has N/2 latches interconnected as a twisted-ring counter. The N/2 latches of counter 50 are coupled in a cascade arrangement where each n-latch is disposed between two i-latches and each i-latch is disposed between two n-latches. A non-inverting (Q) output of each of (N/2)−1 of the latches is connected to a data (D) input of a following latch. An inverting (not-Q) output of one n-latch is connected to the data input of a following i-latch, thus closing the ring and providing the twist. In the preferred embodiment of FIG. 3, N is eight and the N/2 latches are provided by latches 51–54, with the non-inverting outputs of i-latch 51, n-latch 52, and i-latch 53, and the inverting output of n-latch 54 respectively connected to the data inputs of n-latch 52, i-latch 53, n-latch 54, and i-latch 51.

Figure 1:
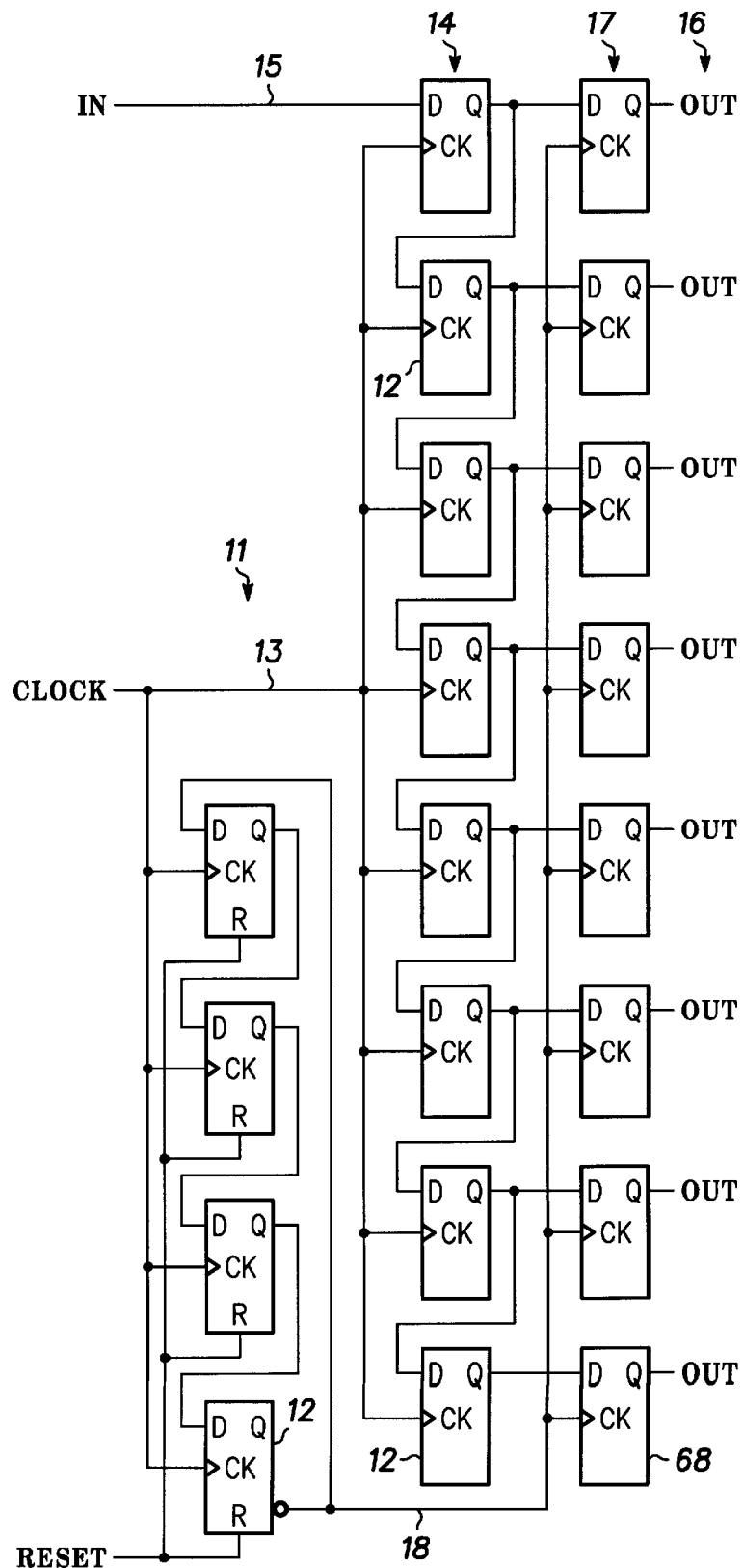
FIG. 1 depicts a prior-art temporal-to-spacial converter containing a twisted-ring counter.

Latch-based twisted-ring counter 50 has several high-speed design advantages over the prior-art flip-flop-based twisted ring counter 11 shown in FIG. 1. For example, a clocked D-type flip-flop is made up internally of two interconnected transparent latches. Prior-art counter 11 (FIG. 1) is made up of N/2 flip-flops 12 containing N latches. Preferred-embodiment counter 50, on the other hand, is made up of four latches 51–54 and divider 55. Divider 55 is demonstrated as a clocked D-type flip-flop with its inverting output connected to its data input. Thus, divider 55 contains internal transparent latches 56 and 57. Because of this, twisted-ring counter 50 contains (N/2)+2 latches, i.e., N/4 i-latches 51 and 53, N/4 n-latches 52 and 54, and two internal divider latches 56 and 57. Therefore, when N is greater than four, preferred-embodiment twisted-ring counter 50 effects a reduction in the number of latches in the ratio of [(N/2)+2]:N, or 6:8 for the given examples. This reduction in the number of latches equates to a reduction in required chip area and offers a significant advantage in the design of high-speed systems.

In prior-art counter 11 (FIG. 1), clock signal 13 connects to a clock (CK) input of each flip-flop 12 of counter 11 for a loading factor of N/2. In preferred-embodiment counter 50, on the other hand, clock signal 43 is connected only to a clock input of divider 55 for a nominal loading factor of one. This results in a lowering of the drive power required of the circuit producing clock signal 43 by a factor of 1:(N/2), or 1:4 in the given examples. This reduction in loading factor and drive power results in a reduction in overall chip power, and is also an advantage in the design of high-speed systems.

In prior-art counter 11 (FIG. 1), all four flip-flops 12 are directly connected to clock signal 13 and therefore must operate at the rate of clock signal 13 (rate S), resulting in a design requirement of N high-speed latches. In preferred-embodiment counter 50, divider 55 is directly clocked by clock signal 43 and operates at the rate of clock signal 43 (rate R). However, latches 51–54 are enabled by half-clock signals 44 and 45 and operate at rate R/2. This results in a design requirement of two high-speed (transparent) latches 56 and 57 for divider 55 and N/2 lesser-speed latches 51–54. This lessening of design stringency and power-per-latch for latches 51–54 is an advantage in the design of high-speed systems.

Twisted-ring counter 50 may serve, in one embodiment, as sequencer 36 (FIG. 2) contained within spacial-to-temporal converter 25 (FIG. 2). In such an application, the outputs of counter 50 are combinatorially gated (not shown) to provide a one-bit-wide selection pulse. This pulse is used to parallel load a conventional spacial-to-temporal shift register (not shown), which then clocks out data at the clock rate. This provides all the advantages inherent in counter 50, but does affect the performance of the conventional shift register.

Referring again to FIG. 3 and temporal-to-spacial-converter 40, data register 60 is made up of N clocked D-type flip-flops 61, 62, 63, 64, 65, 66, 67, and 68. A serial data signal 46 is coupled to a data input of each of flip-flops 61–68 of data register 60. This causes an increase in loading for serial input data signal 46 over the prior art. This loading increase and the corresponding increase in design difficulty is overshadowed by the reduction in design difficulties produced by a lower rate of operation (described below).

An output of each latch 51–54 of counter 50 is connected to a clock input of each of flip-flops 61–68. Each latch 51–54 has a non-inverting output and an inverting output. By connecting each non-inverting output of latches 51–54 in sequence to a clock input of one of the first N/2 flip-flops 61–64, and each inverting output of latches 51–54 in sequence to a clock input of one of the last N/2 flip-flops 65–68, the N flip-flops 61–68 of data register 60 will be loaded with N bits of serial input data 46 in sequence. This results in each flip-flop 61–68 operating at clock rate R divided by N (rate R/N).

The preferred embodiment of temporal-to-spacial converter 40 in FIG. 3 has several high-speed design advantages over prior-art temporal-to-serial converter 10 in FIG. 1. In prior-art shift register 14 (FIG. 1), each flip-flop 12 is clocked directly by clock signal 13 and must operate at rate S. Taking into account twisted-ring counter 11, temporal-to-spacial converter 10 has N+(N/2) flip-flops operating at rate S. This results in a design requirement of 3N high-speed latches. Preferred-embodiment data register 60 (FIG. 3), on the other hand, has no flip-flops operating at clock frequency. Taking into account twisted-ring counter 50, twisted-ring counter 40 has one flip flop operating at rate R, four latches operating at rate R/2, and N flip-flops operating at rate R/N. This results in a design requirement of two high-speed rate R latches, N/2 lesser-speed rate R/2 latches, and 2N least-speed rate R/N latches. This lessening of design stringency and power-per-latch is an advantage in the design of high-speed systems.

In prior-art converter 10 (FIG. 1), clock signal 13 connects directly to a clock input of each flip-flop 12 of both counter 11 and shift register 14 for a loading factor of (N/2)+N. In preferred embodiment converter 40 (FIG. 3), on the other hand, clock signal 43 is connected only to the clock input of divider 55 for a nominal loading factor of one. This results in a lowering of the drive power required of the circuit producing clock signal 43 by a factor of 1:[(N/2)+2], or 1:12 in the given examples. This reduction in loading factor and drive power results in a reduction in overall chip power, and is also an advantage in the design of high-speed systems.

Temporal-to-serial converter 40 also includes a transfer register (not shown) similar in implementation and operation to prior-art transfer register 17 (FIG. 1). Parallel output data 47 is transferred from the non-inverting output of each flip-flop 61–68 to the data input of each flip-flop (not shown) in the transfer register under control of a transfer signal 48. Transfer signal 48 may be provided by counter 50 in a manner analogous to prior-art transfer signal 18 (FIG. 1) and prior-art counter 11 (FIG. 1).

Additionally, twisted-ring counter 50 includes a reset signal 49 which, when activated, sets divider 55 and latches 51–54 to a predetermined state, usually with all non-inverting outputs at a zero state. This reset line may be activated in any number of ways well known to those skilled in the art, by a simple gating circuit, or by a sequencer such as that described below in conjunction with FIG. 4.

Temporal-to-spacial converter 40 may serve, in one embodiment, as temporal-to-spacial converter 33 (FIG.2) in the preferred embodiment. Similarly, twisted-ring counter 50 may serve, in one embodiment, as sequencer 36 (FIG. 2) contained within temporal-to-spacial converter 33.

Those skilled in the art will appreciate that other types of transparent latches and flip-flops may be used for latches 51–54 and divider 55 of twisted-ring counter 50 and for flip-flops 61–68 of data register 60 without departing from the scope and spirit of the present invention.

Those skilled in the art will also appreciate that the design of preferred-embodiment counter 50 is not limited to twisted-ring counters where N equals eight, and may be extended to counters of any length where N is an integer multiple of four. Also, the advantages of preferred-embodiment counter 50 over prior-art counter 11 (FIG. 1) increase as N increases. For example, a thirty-two state preferred-embodiment counter would have (N/2)+2 equals eighteen latches, whereas thirty-two state prior-art counter would have N equals thirty-two latches.

Figure 4:
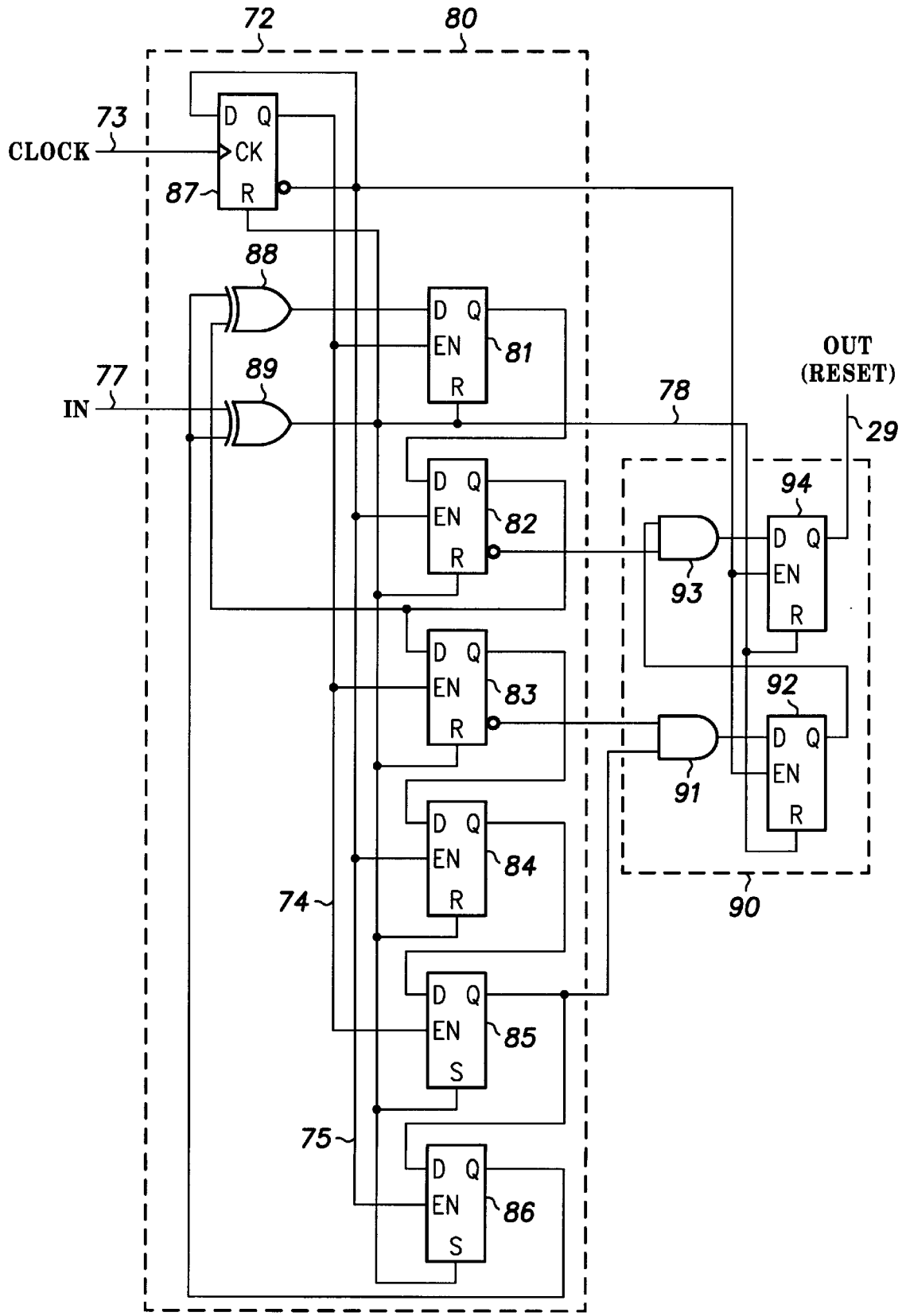
FIG. 4 depicts a sequence-controlled digital circuit configured as a latch-based pseudorandom noise sequence detector in accordance with a preferred embodiment of the present invention.

FIG. 4 depicts a sequence-controlled digital circuit configured as a latch-based pseudorandom-noise (PN) sequence detector 70 in accordance with a preferred embodiment of the present invention. The following discussion refers to FIG. 4.

PN sequence detector 70 is depicted in FIG. 4 as a fourteen-bit PN sequence detector 70 having a sixteen-state counter 80. This depiction should be taken as exemplary of an X-bit PN detector 80, where X is the number of bits in the PN sequence. The number of states of counter 80 is normally greater than the number of bits in the sequence.

PN sequence detector 70 is made up of a latch-based sequencer 72, embodied as a modified-ring counter 80 and an output logic circuit 90. Detector 70 may serve, in one embodiment, as frame-synchronization generator 28 (FIG. 2), and, in another embodiment, as frame-synchronization detector 34 (FIG. 2).

Counter 80 is depicted as having a divider 87, six transparent latches 81, 82, 83, 84, 85, and 86 connected through a combinatorial logic element 88, and a combinatorial reset element 89.

Divider 87 is a clocked D-type flip-flop configured to divide a clock signal 73 by two. This produces a non-inverted half-clock signal 74 and an inverted half-clock signal 75. Half-clock signals 74 and 75 are alternately coupled to the enable inputs of transparent latches 81–86. Since this example has six latches 81–86, non-inverted half-clock signal 74 is connected to the enable inputs of n-latches 81, 83, and 85, while inverted half-clock signal 75 is connected to the enable inputs of i-latches 82, 84, and 86.

Counter 80 has N latches interconnected as a modified-ring counter, where N is the number of latches required for a counter with more possible states than the number of bits in the PN sequence. The N latches of counter 80 are coupled in a cascade arrangement where, when the ring-closing feedback is considered, each n-latch is disposed between at least two i-latches and each i-latch is disposed between at least two n-latches. Each latch potentially contains a non-inverting output and an inverting output. A non-inverting output of each of N-1 of the latches is connected to a data input of a following latch, as is typical of a ring counter. The outputs of at least two latches are connected, through combinatorial logic element 88, embodied in an exclusive-OR gate in this embodiment, to a data input of at least one latch to close the ring. In the preferred embodiment of FIG. 4, N is six. The non-inverting outputs of n-latch 81, i-latch 82, n-latch 83, i-latch 84, and n-latch 85 are respectively connected to the data inputs of i-latch 82, n-latch 83, i-latch 84, n-latch 85, and i-latch 86. In addition, the non-inverting outputs of latches 82 and 86 are routed through combinatorial logic element 88 (in this case, an XOR gate) to the data input of latch 81.

PN-sequence detector 70 may serve as frame-synchronization detector 34 (FIG. 2). This configuration is achieved though combinatorial reset logic element 89, embodied as an exclusive-OR gate in this embodiment, where an input signal 77 containing a stream of serial data is gated with the output of the final latch 86 of counter 80 to produce a reset signal 78. In this manner, whenever the serial data sequence of input signal 77 departs from the PN sequence generated by counter 80, counter 80 is reset. The PN sequence of counter 80, therefore, will only be produced when the serial data sequence of input signal 77 is identical to the PN sequence.

The replacement of input signal 77 with a reset control signal (not shown) allows combinatorial reset element 89 to hold counter 80 in a reset condition until a PN sequence is desired. In this embodiment, detector 70 becomes a PN-sequence generator (not shown) and may serve as frame-synchronization generator 28 (FIG. 2).

The exact structure and connections of combinatorial logic element 88 determine the PN sequence of counter 80. In the logic of counter 80, the feedback through combinatorial logic element 88 causes the "walking bit" of a conventional ring-counter to be modified into a PN sequence. Counter 80, as embodied in FIG. 4, is a fourteen-state counter. That is, it is a sixteen-possible-state counter truncated to fourteen states by combinatorial logic element 88. The possible states of counter 80 are depicted in Table 1 below.

TABLE 1

| | Non-Inverting Outputs of Latches | | | | | |
|---|---|---|---|---|---|---|
| STATE | 81 | 82 | 83 | 84 | 85 | 86 |
| (RESET) 1 | 0 | 0 | 0 | 0 | 1 | 1 |
| 2 | 1 | 0 | 0 | 0 | 0 | 1 |
| 3 | 1 | 1 | 0 | 0 | 0 | 0 |
| 4 | 1 | 1 | 1 | 0 | 0 | 0 |
| 5 | 1 | 1 | 1 | 1 | 0 | 0 |
| 6 | 1 | 1 | 1 | 1 | 1 | 0 |
| 7 | 1 | 1 | 1 | 1 | 1 | 1 |
| 8 | 0 | 1 | 1 | 1 | 1 | 1 |
| 9 | 0 | 0 | 1 | 1 | 1 | 1 |
| 10 | 1 | 0 | 0 | 1 | 1 | 1 |
| 11 | 1 | 1 | 0 | 0 | 1 | 1 |
| 12 | 0 | 1 | 1 | 0 | 0 | 1 |
| 13 | 0 | 0 | 1 | 1 | 0 | 0 |
| 14 | 0 | 0 | 0 | 1 | 1 | 0 |
| 15 | 0 | 0 | 0 | 0 | 1 | 1 |

As can be seen from Table 1, state 15 is identical to state 1, the reset state. The final state in the sequence, therefore, is state 14. The PN sequence generated by counter 80 in the embodiment of FIG. 4 is 11000011111100.

When the PN sequence of counter 80 is decoded through output logic circuit 90, an output signal 79 is obtained. The exemplary embodiment of FIG. 4 utilizes a combinatorial element 91 coupled to a transparent latch 92 to detect and hold the state-14 condition of counter 80, then a second combinatorial element 93 and a second transparent latch 93 to detect and hold the state-15 condition of counter 80. This results in an output signal 79 whenever the PN sequence has been completed.

Those skilled in the art will appreciate that an appropriate configuration of logic element 88 may be used to produce different PN sequences. The PN sequence thus obtained may be of any desired length, utilizing any necessary form of combinatorial logic element 88 and output logic circuit 90. Any variation from the logic and the sequence depicted in FIG. 4 does not depart from the intent or the scope of the present invention.

Those skilled in the art will appreciate that other types of transparent latches may be used for latches 81–86, 92 and 94, other types of flip-flop may be used for divider 87, and that other types of combinatorial logic may be used for elements 88, 89, 91, and 93 without departing from the scope and spirit of the present invention.

Figure 5:
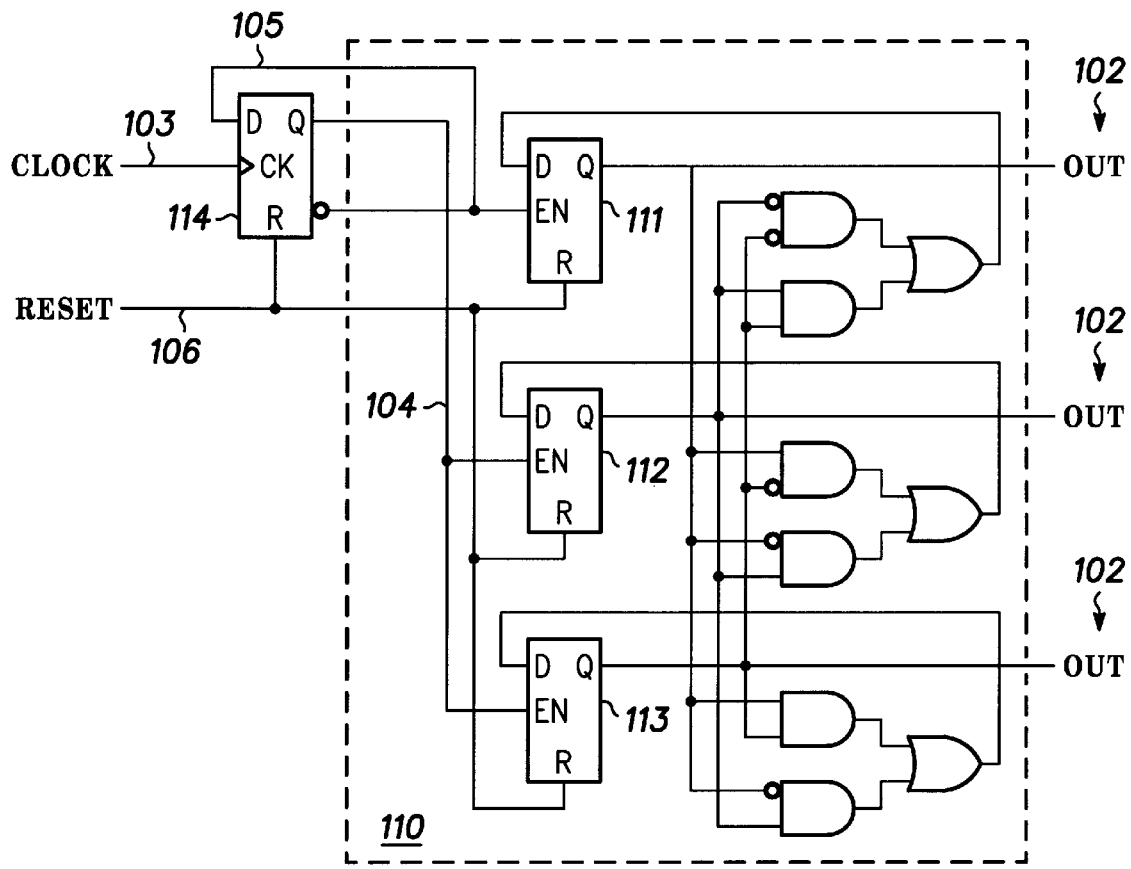
FIG. 5 depicts a sequence-controlled digital circuit configured as a latch-based Gray-code generator in accordance with a preferred embodiment of the present invention.

FIG. 5 depicts a sequence-controlled digital circuit configured as a latch-based Gray-code generator 100 in accordance with a preferred embodiment of the present invention. The following discussion refers to FIG. 5.

There is often a requirement for a digital sequencer to utilize a Gray-code sequence, i.e., a sequence in which only one element changes per state. In prior art (not shown), such a sequencer typically utilizes a counter containing N flip-flops, hence 2N latches, where N is an integer exponent of two defining the maximum number of states of the counter, i.e., the counter may have up to $2^N$ states. Combinatorial logic is used to determine the count sequence.

Generator 100 is made up of a $2^N$ state counter 110 with N transparent latches, a divider 114, and N combinatorial logic elements. Counter 110 produces an N-bit parallel output signal 102 containing the desired Gray-code sequence. In the embodiment depicted in FIG. 5, N equals three, counter 110 sequences through eight states, and parallel output signal 102 is three bits wide.

In the preferred embodiment, divider 114 is a clocked D-type flip-flop configured to divide a clock signal 103 by two. This produces a non-inverted half-clock signal 104 and an inverted half-clock signal 105. Half-clock signals 104 and 105 are coupled to the enable inputs of transparent latches 111, 112, and 113. In the exemplary embodiment of FIG. 5, inverted half-clock signal 105 connects to the enable input of latch (i-latch) 111 while non-inverted half-clock signal 104 connects to the enable inputs of latches (n-latches) 112 and 113. Hence, Gray-code counter 110 contains a single i-latch and N-1 n-latches. Those skilled in the art will realize that transposing the above connections to utilize a single n-latch and N-1 i-latches will have no significant effect upon the performance of counter 110, and does not depart from the scope or intent of the present invention.

The use of divider 114 and transparent latches 111–113 allows the use of (N/2)+2 latches for counter 110, as compared with N latches for the prior art (not shown). This means that for any value of N greater than two there is a savings in the number of latches required, and that savings increases as N increases. This effects an advantage in the design of high-speed circuits. Additionally, only divider 114 operates at the rate of clock signal 103, with latches 111–113 operating at half that rate. This, too, effects an advantage in the design of high-speed circuits.

The desired Gray-code sequence in the exemplary embodiment is 000, 001, 011, 010, 110, 111, 101, and 100. To achieve this sequence, the data inputs of each latch 111–113 are coupled through three combinatorial logic elements 115, 116, and 117 to the outputs of at least two of latches 111–113 as required. In the exemplary embodiment, this takes the form of the following equations (1), (2), and (3).

$$D_{111} = (\text{not}Q_{112} \text{ AND } \text{not}Q_{113}) \text{ OR } (Q_{112} \text{ AND } Q_{113}) \quad (1)$$

$$D_{112} = (Q_{111} \text{ AND } \text{not}Q_{113}) \text{ OR } (\text{not}Q_{111} \text{ AND } Q_{112}) \quad (2)$$

$$D_{113} = (Q_{111} \text{ AND } Q_{113}) \text{ OR } (\text{not}Q_{111} \text{ AND } Q_{112}) \quad (3)$$

where $D_{111}$, $D_{112}$, and $D_{113}$; $Q_{111}$, $Q_{112}$, and $Q_{113}$; and $\text{not}Q_{111}$, $\text{not}Q_{112}$, and $\text{not}Q_{113}$ are the data inputs, non-inverting outputs, and inverting outputs of latches 111, 112, and 113, respectively.

In addition, counter 110 has a reset signal 106 that may be used to reset counter 110 to a zero state as required.

Those skilled in the art will appreciate that the embodiment of counter 110 depicted in FIG. 5 is an eight-state counter utilizing D-type latches and flip-flop, and that other numbers of states and other types of latches and flip-flop may be used without departing from the scope or intent of the present invention.

In summary, embodiments 42 (FIG. 3), 72 (FIG. 4) and 100 (FIG. 5) of a latch based sequencer are exemplary of a class of latched based sequencers that may be used to form sequence-controlled digital circuits to reduce the chip area and design complexity required thereof by reducing the loading on high-speed clock lines, reducing overall number of required latches, and reducing the number of latches operating at the full clock rate.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A sequence-controlled digital circuit comprising:
    a divider configured to divide a clock signal by two to produce an inverted half-clock signal and a non-inverted half-clock signal;
    an i-latch formed from a transparent latch enabled by said inverted half-clock signal, said i-latch being coupled to said divider; and
    an n-latch formed from a transparent latch enabled by said non-inverted half-clock signal, said n-latch being coupled to said divider and to said i-latch.

2. A sequence-controlled digital circuit as claimed in claim 1 wherein said divider comprises a flip-flop having two transparent latches.

3. A sequence-controlled digital circuit as claimed in claim 1 wherein:
    said i-latch is one of N/4 i-latches included in said circuit, where N is an integer multiple of four, and where said i-latches are formed from transparent latches and enabled by said inverted half-clock signal;
    said n-latch is one of N/4 n-latches included in said circuit, where said n-latches are formed from transparent latches and enabled by said non-inverted half-clock signal; and
    said divider, said i-latches, and said n-latches are configured as a twisted-ring counter having N states.

4. A sequence-controlled digital circuit as claimed in claim 3 wherein said transparent latches couple together in a cascade arrangement with each of said n-latches being disposed between two of said i-latches.

5. A sequence-controlled digital circuit as claimed in claim 4 wherein:
    each of (N/2)−1 of said transparent latches has a non-inverting output which couples to a data input of another of said transparent latches; and
    one of said transparent latches has an inverting output which couples to a data input of another of said transparent latches.

6. A sequence-controlled digital circuit as claimed in claim 3 additionally comprising a register having N flip-flops, said register being coupled to said twisted-ring counter to form a temporal-to-spacial converter.

7. A sequence-controlled digital circuit as claimed in claim 6 wherein:
    each of said N flip-flops has a data input and a clock input;
    said data inputs of said N flip-flops couple together and are adapted to receive a serial data signal at a rate of one bit per cycle of said clock signal; and
    said clock inputs of said N flip-flops couple to said transparent latches so that each of said N flip-flops is clocked at a rate of 1/N times said clock signal.

8. A sequence-controlled digital circuit as claimed in claim 7 wherein:
    each of said transparent latches has a non-inverting output and an inverting output;
    each non-inverting output of each transparent latch drives one flip-flop clock input of said register; and
    each inverting output of each transparent latch drives one flip-flop clock input of said register.

9. A sequence-controlled digital circuit as claimed in claim 1 wherein:
    said i-latch is one of N/2 i-latches included in said circuit, where N is an integer multiple of two, and where said i-latches are formed from transparent latches and enabled by said inverted half-clock signal;
    said n-latch is one of N/2 n-latches included in said circuit, where said n-latches are formed from transparent latches and enabled by said non-inverted half-clock signal;
    said circuit additionally comprises a combinatorial logic element having inputs coupled to two of said transparent latches and an output couple to one of said transparent latches; and said i-latches, said n-latches, said combinatorial logic element, and said divider are configured as a pseudo-noise generator.

10. A sequence-controlled digital circuit as claimed in claim 9 wherein said transparent latches couple together in a cascade arrangement with each n-latch being disposed between two i-latches.

11. A sequence-controlled digital circuit as claimed in claim 10 wherein:

said pseudo-noise generator is configured to produce a predetermined state sequence;

each of N-1 of said transparent latches has a non-inverting output which couples to an input of another of said transparent latches; and two of said transparent latches have outputs which couple through said combinatorial logic element to produce a feedback signal, said feedback signal being coupled to an input of one of said transparent latches.

12. A sequence-controlled digital circuit as claimed in claim 1 wherein:

said n-latch is one of N-1 n-latches included in said circuit, where N is an integer, and where said n-latches are formed from transparent latches and enabled by said non-inverted half-clock signal; and said divider, said i-latch, and said n-latches are configured as a Gray-code generator having $2^N$ states.

13. A sequence-controlled digital circuit as claimed in claim 12 wherein:

said Gray-code generator is configured to produce a predetermined state sequence; and outputs of two of said transparent latches are coupled through a gate to an input of one of said transparent latches to produce a gated feedback signal, said gated feedback signal being coupled to an input of one of said transparent latches.

14. A method for controlling a sequence of states in a digital circuit, said method comprising the steps of:

a) dividing a clock signal into an inverted half-clock signal and a non-inverted half-clock signal;

b) enabling an i-latch by said inverted half-clock signal, said i-latch being a transparent latch; and c) enabling an n-latch by said non-inverted half-clock signal, said n-latch being a transparent latch.

15. A sequence-controlling method as claimed in claim 14 wherein:

said method controls a sequence of N states, where N is an integer multiple of four;

said i-latch is one of N/4 i-latches included in said digital circuit, where said i-latches are all transparent latches and said enabling step b) enables all of said i-latches by said inverted half-clock signal;

said n-latch is one of N/4 n-latches included in said circuit, where said n-latches are all transparent latches and said enabling step c) enables all of said n-latches by said non-inverted half-clock signal;

said method additionally comprises the step of cascading said transparent latches so each of said n-latches is disposed between two of said i-latches;

said cascading step comprises the step of coupling a non-inverting output of each of (N/2)-1 of said transparent latches to a data input of another of said transparent latches; and said cascading step additionally comprises the step of coupling an inverted output of one of said transparent latches to a data input of another of said transparent latches.

16. A sequence-controlling method as claimed in claim 15 wherein said digital circuit forms an N-bit temporal-to-spacial converter and said method additionally comprises the steps of:

distributing a serial data signal to a data input of each of N flip-flops at a rate of one bit per cycle of said clock signal; and driving clock inputs of each of said flip-flops with outputs of said transparent latches so that each of said N flip-flops is clocked at a rate of 1/N times said clock signal.

17. A sequence-controlling method as claimed in claim 14 additionally comprising the step of configuring said digital circuit as a pseudo-noise generator, and wherein:

said i-latch is one of N/2 i-latches included in said digital circuit, where N is an integer multiple of two, where said i-latches are all transparent latches, and where said enabling step b) enables all of said i-latches by said inverted half-clock signal;

said n-latch is one of N/2 n-latches included in said circuit, where said n-latches are all transparent latches, and where said enabling step c) enables all of said n-latches by said non-inverted half-clock signal;

said configuring step comprises the step of cascading said transparent latches so each of said n-latches is disposed between two of said i-latches;

said cascading step comprises the step of coupling a non-inverting output of each of N-1 of said transparent latches to a data input of another of said transparent latches; and said cascading step additionally comprises the step of coupling, through a combinatorial logic element, outputs of two of said transparent latches to a data input of another of said transparent latches.

18. A sequence-controlling method as claimed in claim 14 additionally comprising the step of configuring said digital circuit as a Gray-code generator having N states, where N is an integer multiple of four, wherein:

said n-latch is one of N-1 n-latches included in said circuit, where said n-latches are all transparent latches, and where said enabling step c) enables all of said n-latches by said non-inverted half-clock signal;

said configuring step comprises the step of coupling, through a gate, outputs of two of said transparent latches to a data input of one of said transparent latches.

19. A sequence-controlled digital circuit for sequencing through N states, where N is an integer multiple of four, comprising:

a divider configured to divide a clock signal by two to produce an inverted half-clock signal and a non-inverted half-clock signal;

N/2 transparent latches coupled to said divider so that N/4 of said transparent latches are i-latches enabled by said inverted half-clock signal and N/4 of said transparent latches are n-latches enabled by said non-inverted half-clock signal, wherein said transparent latches couple together in a cascade arrangement with each of said n-latches being disposed between two of said i-latches, and each of said transparent latches has an non-inverting output and an inverting output, said non-inverting output of each of (N/2)-1 of said transparent latches being coupled to a data input of another of said transparent latches, and said inverting output of one of said transparent latches being coupled to a data input of another of said transparent latches; and N flip-flops coupled to said transparent latches, each of said flip-flops having a data input and a clock input, wherein said data inputs are coupled together and adapted to receive a serial data signal at a rate of one bit per cycle of said clock signal, wherein each of said clock inputs is coupled to said transparent latches so that each of said flip-flops is clocked at a rate of 1/N times said clock signal, and each of said clock inputs is driven by one of said non-inverting and inverting outputs of said transparent latches, and wherein said divider, said transparent latches, and said flip-flops are configured as an N-bit temporal-to-spacial converter.

* * * * *